(12) United States Patent
Sauer et al.

(10) Patent No.: US 6,900,633 B2
(45) Date of Patent: May 31, 2005

(54) SUBSTANCE DETECTION BY NUCLEAR QUARDRUPOLE RESONANCE USING AT LEAST TWO DIFFERENT EXCITATION FREQUENCIES

(75) Inventors: Karen L. Sauer, Alexandria, VA (US); Bryan H. Suits, Houghton, MI (US); Joel B. Miller, Cheverly, MD (US); Allen N. Garroway, Davidsonville, MD (US); Young K. Lee, San Diego, CA (US); Shouqin Huo, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/183,351

(22) Filed: Jun. 28, 2002

(65) Prior Publication Data

US 2003/0071619 A1 Apr. 17, 2003

Related U.S. Application Data

(60) Provisional application No. 60/301,821, filed on Jul. 2, 2001.

(51) Int. Cl.[7] .................................... G01V 3/00
(52) U.S. Cl. ........................................ 324/307
(58) Field of Search ................ 324/300–309, 324/318

(56) References Cited

U.S. PATENT DOCUMENTS

| | | | |
|---|---|---|---|
| 3,643,181 A | * | 2/1972 | Stirrat et al. ............... 332/120 |
| 4,816,766 A | | 3/1989 | Zabel et al. |
| 5,206,592 A | | 4/1993 | Buess et al. |
| 5,233,300 A | | 8/1993 | Buess et al. |
| 5,365,171 A | | 11/1994 | Buess et al. |
| 5,583,437 A | * | 12/1996 | Smith et al. ............... 324/307 |
| 5,608,321 A | | 3/1997 | Garroway et al. |
| 5,719,499 A | * | 2/1998 | Chandrakumar ............ 324/322 |
| 5,804,967 A | | 9/1998 | Miller et al. |
| 6,054,856 A | | 4/2000 | Garroway et al. |
| 6,091,240 A | * | 7/2000 | Smith et al. ............... 324/300 |
| 6,100,687 A | * | 8/2000 | Weitekamp et al. ........ 324/300 |
| 6,104,190 A | | 8/2000 | Buess et al. |
| 6,177,797 B1 | * | 1/2001 | Srinivasan ................. 324/318 |
| 6,208,136 B1 | * | 3/2001 | Smith et al. ............... 324/300 |
| 6,222,364 B1 | * | 4/2001 | Smith et al. ............... 324/300 |
| 6,522,135 B2 | * | 2/2003 | Miller et al. ............... 324/300 |
| 6,566,873 B1 | * | 5/2003 | Smith et al. ............... 324/300 |
| 6,577,128 B1 | * | 6/2003 | Smith et al. ............... 324/309 |

FOREIGN PATENT DOCUMENTS

RU 1303915 A1 4/1987

OTHER PUBLICATIONS

K.L. Sauer, B.H. Suits, A.N. Garroway, and J.B. Miller, Three–frequency nuclear quadrupole resonance of spin–1 nuclei, Chemical Physics Letters 342, 362, 2001.

VEGA, "Theory of T1 relaxation measurements in pure nuclear quadrupole resonance for spins I=1," J. Chem. Phys. 61, 1974, p. 1093.

(Continued)

*Primary Examiner*—Diego Gutierrez
*Assistant Examiner*—Dixomara Vargas
(74) *Attorney, Agent, or Firm*—John J. Karasek; Stephen T. Hunnius; Amy Ressing

(57) ABSTRACT

This invention involves an apparatus to measure the nuclear quadrupole (NQR) response of a specimen using three frequencies. Three-frequency NQR involves excitation of at least two transitions that causes an observed signal at a third transition frequency. Thus, the transition excited and detected is not irradiated at all. This reduces undesirable interfering signals due to the excitation, for example as a result of acoustic ringing and/or tank circuit ring-down, since the excitation is not applied at the frequency that is detected. This invention will be particularly useful to detect substances selected from the group consisting of explosives and narcotics using nitrogen NQR.

40 Claims, 10 Drawing Sheets

OTHER PUBLICATIONS

Hanazato et al, "Excitation and detection of coherence between forbidden levels in three–levels in three–level spin system by multi–step processes," J. Phys. Soc. Japan 39, 1975 p. 835.

Hanazato et al, "Transient nutations and spin echoes associated with two–quantum transition in multi–level NMR," J. Phys. Soc. Japan 39, 1975 p. 1139.

Grechishkin et al, "2–Frequency NQR–echo in an electric field," Izv. Vuz. Fiz. 6, 1976, p. 140.

Kirchanov et ak, "The two–frequency nuclear quadrupole resonance echo for the spin J=I," Russian Journal of Physical Chemistry 53, 1979, p. 34.

Anferov et al, "2–Frequency NQR–NMR doulble resonance in compounds containing nitrogen," J. Mol. Struct. 83, 1982, p. 135.

Grechishkin et al, "Adiabatic Demagnetization and two–frequency methods in 14 N quadrupole resonance spectroscopy," J. Mol. Struct. 83, 1982, p. 135.

Grechishkin, "Quantum beats at the two–frequency excitation of NQR in crystals," Izv. Vuz. Fiz. 33, 1990, p. 87.

Grechiskin et al, "2–Dimensional 2–Frequency NQR spectroscopy," Z. Naturforsch. A 47, 1992, p. 430.

Grechiskin et al, "Remote nuclear quadrupole resonance in solids," Physics–Uspekhi 36, 1993, p. 980.

Grechiskin et al, "Time reversal in two–frequency NQR methods," Phys. Solid State 39, 1997, p. 1206.

Liao et al, "Two–dimensional nuclear magnetic resonance correlation spectroscopy at zero field," J. Chem. Phys. 111, 1999, p. 3077.

Mozjoukhine,"The two–frequency nuclear quadrupole resonance for explosive detection," Appl. Magn. Reson. 18, 2000, p. 527.

Grechishkin, "Quantum beats at the two–frequency excitation of NQR in crystals," Izv. Vuz. Fiz. 33, 1990, p. 87–88.

Garroway et al, "Explosives detection by nuclear quadrupole resonance (NQR)", Spie, 2276, 1994, 139–149.

Garroway et al, "Narcotics and explosives detection by 14 N pure NQR,", Spie, 2092, 1993, 318–327.

* cited by examiner

SUBSTANCE DETECTION BY NUCLEAR QUARDRUPOLE RESONANCE USING AT LEAST TWO DIFFERENT EXCITATION FREQUENCIES

This application claims the benefit of provisional application No. 60/301,821 filed Jul. 2, 2001.

BACKGROUND OF THE INVENTION

1. Field of the Invention

The present invention relates to nuclear quadrupole resonance (NQR). More specifically, the present invention relates to the excitation of two frequencies to create the desired signal at a third frequency, and also the method and techniques for the creation of spin echoes and other signals analogous to those obtained with standard multipulse single-frequency NQR methods.

2. Description of the Related Art

Nuclear quadrupole resonance (NQR) is a technique for detecting target specimens containing sub-kilogram quantities of narcotics and explosives having quadrupolar nuclei. Such substances include nitrogenous or chlorine-containing explosives and narcotics. Basically, quadrupolar nuclei will exhibit nuclear quadrupole resonance—a change in the angle of nuclear spin with respect to its quantization axis when it is excited by radio frequency (RF) radiation pulses at a particular frequency. In the better-known nuclear magnetic resonance (NMR), the quantization axis is determined externally by the direction of the applied magnetic field. In NQR, the quantization axis is determined by molecular parameters. As with NMR, different chemicals require pulses of different frequencies (i.e., different nuclear quadrupole resonance frequencies) to cause precession in nuclei. A device used to detect magnetic or NQR resonance in the quadrupolar nuclei of a target specimen is tuned to emit pulses at the frequency corresponding to the resonance frequency of the nuclei desired to be detected. A typical NQR excitation/detection circuit consists of an inductor capacitively tuned to the NQR frequency and nominally matched to the impedance of a transmitter or receiver by another capacitor or inductor. In this regard, the present invention is related to other methods of NQR detection as taught in U.S. Pat. No. 5,206,592 issued Apr. 27, 1993 to Buess et al. for DETECTION OF EXPLOSIVES BY NUCLEAR QUADRUPOLE RESONANCE, and U.S. Pat. No. 5,233,300 issued Aug. 3, 1993 to Buess et al. for DETECTION OF EXPLOSIVE AND NARCOTICS BY LOW POWER LARGE SAMPLE VOLUME NUCLEAR QUADRUPOLE RESONANCE, and U.S. Pat. No. 5,365,171 issued Nov. 15, 1994 to Buess et al. for REMOVING THE EFFECTS OF ACOUSTIC RINGING AND REDUCING THE TEMPERATURE EFFECTS IN THE DETECTION OF EXPLOSIVES BY NQR, and U.S. Pat. No. 5,608,321 issued Mar. 4, 1997 to Garroway et al. for A MEANS FOR DETECTING EXPLOSIVES AND NARCOTICS BY STOCHASTIC NUCLEAR QUADRUPOLE RESONANCE (NQR), and U.S. Pat. No. 5,804,967 issued Sep. 8, 1998 to Miller et al. for A MEANS FOR GENERATING SHORT RF PULSES WITH RAPID DETECTOR RECOVERY IN STOCHASTIC MAGNETIC RESONANCE, and U.S. Pat. No. 6,242,918 issued Jun. 5, 2001 to Hepp et al. for APPARATUS AND METHOD FOR REDUCING THE RECOVERY PERIOD OF A PROBE IN PULSED NUCLEAR QUADRUPOLE RESONANCE AND NUCLEAR MAGNETIC RESONANCE DETECTION SYSTEMS BY VARYING THE IMPEDANCE OF A LOAD TO REDUCE TOTAL Q FACTOR, and U.S. Pat. No. 6,054,856 issued Apr. 25, 2000 to Suits et al. for MAGNETIC RESONANCE DETECTION COIL THAT IS IMMUNE TO ENVIRONMENTAL NOISE, and U.S. Pat. No. 6,104,190 issued Aug. 15, 2000 to Buess et al. for MEANS FOR DETECTING NITRAMINE EXPLOSIVES BY $^{14}$N NQR OF NITRO GROUPS, all of which are incorporated by reference herein.

It is common to detect a magnetic resonance signal by placing a sample to be measured in a tuned, electronically resonant tank circuit. Then, the response of the tank circuit to the electromotive force produced by nuclear or electronic spins in the sample is measured. With Nuclear Magnetic Resonance (NMR) or Nuclear Quadrupole Resonance (NQR), the sample is placed in or near an inductor, commonly referred to as a coil, that detects AC magnetic fields.

The inductance of the coil is tuned with a parallel and/or series capacitance to make the circuit electrically resonant at the measurement frequency. One or more additional reactive impedances (inductors or capacitors) are typically added to adjust the resistive impedance at resonance to a particular value which optimizes the detection sensitivity.

Although the NQR detection technique works reasonably well in some circumstances, one of the challenges that NQR faces is that when applying the RF magnetic field needed to detect NQR, one can create false signals at or near the NQR frequency. For example, acoustic vibrations are created in certain magnetic metals. In turn, as the magnetic domains in the metal vibrate, they induce a signal back in the NQR receiver coil at essentially the same frequency as the driving frequency. For example, if one has a suitcase with chrome trimmings, the detected signal may indicate that there are explosives in the suitcase when in fact it is acoustic ringing from the chrome that is observed.

A multiple-frequency technique would eliminate the false alarms due to acoustic ringing. For example, for a spin-1 nucleus such as $^{14}$N, the three transition frequencies between the levels are discrete. The basic concept is to use two of the frequencies to excite the third transition, and to then detect the signal from this third transition. This avoids any interference from acoustic ringing since the RF is not applied at the frequency that is detected. The method disclosed here is the first direct observation of a NQR transition near a frequency that has not been used for irradiation.

There is another advantage to not irradiating at the observation frequency: the probe recovery time is greatly reduced. Following a high power RF pulse one has to wait for the energy stored in the coil to dissipate before signal can be detected. This recovery time is typically about 20 coil ringdown time constants. The ringdown time is proportional to the coil quality factor, Q, and inversely proportional to the frequency. At low frequency, a substantial portion of the signal may be lost during the recovery time. In three-frequency NQR, the energy stored in the observation coil is limited to that which may leak in from the excitation at other frequencies. Therefore, improved sensitivity is expected with three-frequency NQR at low frequencies when the signal lifetime is short.

The nuclear wave function evolves under a Hamiltonian consisting of the large time-independent quadrupole term and the much smaller time-dependent terms corresponding to the alternating RF magnetic fields applied at two of the three characteristic NQR frequencies. For example, with frequencies for spin-1 nuclei and the principal axes frame (x, y, z) of the electric field gradient tensor at the quadrupolar nucleus, the quadrupolar Hamiltonian $H_Q$ is $H_Q = e^2qQ$ $[(3I_z^2-I^2)+\eta(I_x^2-I_y^2)]/4$ where I is the nuclear angular momentum operator, $\eta$ the asymmetry parameter of the electric field gradient, q the field gradient, and Q the quadrupole moment of the nucleus. The transition frequencies between the eigenfunctions of $H_Q$ are $\omega_\pm=(3\pm\eta)e^2qQ/4\hbar$ and $\omega_0=\eta e^2qQ/2\hbar$. Here, it is assumed $\eta\neq 0$ or 1 to avoid degenerate energy levels and transition frequencies which complicate the calculation. To be concise, only the observation at $\omega_+$ arising from irradiation at $\omega_-$ and $\omega_0$ is here treated in detail, but similar results are expected for other three-frequency combinations.

For a spin-1 nucleus each transition is allowed under a different orientation of the applied field in the principal axes frame (i.e., $<+|I|->=<+|I_z|->$, $<0|I|->=<0|I_y|->$, and $<+|I|0>=<+|I_x|0>$). Therefore, for a single crystal, the most efficient NQR excitation and detection occur when an RF magnetic field of frequency $\omega_0$ is applied along the z-direction, that of $\omega_-$ along y, and the $\omega_+$ detection coils are sensitive to magnetization oscillating along x. Similarly, for a powder sample it can be shown that the maximum signal is obtained if the two RF magnetic fields are mutually perpendicular to one another in the laboratory frame (x', y', z'). The received 'three-frequency' NQR signal then arises from a magnetization which is orthogonal to both the applied RF fields.

The Hamiltonian for the interaction of the nucleus with an RF pulse of magnetic field strength $B_{1-}$ and frequency $\omega_-$ applied along the x'-axis is $H_{1-}=-\hbar\gamma_N B_{1-} I_{x'} \cos\omega_- t$ and with an RF pulse of strength $B_{10}$ and frequency $\omega_0$ along y' is $H_{10}=-\hbar\gamma_N B_{10} I_{y'}\cos\omega_0 t$. ($\gamma_N$ is the gyromagnetic ratio of the nucleus.) The lab frame operators can be expressed as $$I_{x'}=(\cos\alpha\cos\beta\cos\gamma-\sin\alpha\sin\gamma)I_x+(\sin\alpha\cos\beta\cos\gamma+\cos\alpha\sin\gamma)I_y-\sin\beta\cos\gamma I_z\ I_{y'}=-(\cos\alpha\cos\beta\sin\gamma-\sin\alpha\cos\gamma)I_x+(-\sin\alpha\cos\beta\sin\gamma+\cos\alpha\cos\gamma)I_y+\sin\beta\sin\gamma I_z \quad (1)$$

where $\alpha$, $\beta$, and $\gamma$ are Euler angles describing the relative orientation of the principal axes and lab frames. If it is assumed each RF pulse only excites one transition, $H_{10}$ and $H_{1-}$ can be simplified as $$H_{1-}=-\hbar\gamma_N B_{1-}(\sin\alpha\cos\beta\cos\gamma+\cos\alpha\sin\gamma)I_y\cos\omega_- t\equiv-\hbar\Omega_{1-} I_y\cos\omega_- t\ H_{10}=-\hbar\gamma_N B_{10}(\sin\beta\sin\gamma)I_z\cos\omega_0 t\equiv-\hbar\Omega_{10} I_z\cos\omega_0 t \quad (2)$$

where the dependence on crystal orientation is now contained implicitly in the newly defined terms $\Omega_{10}$ and $\Omega_{1-}$, the effective RF-nutation rates.

Using the above Hamiltonians, the wave function $|\Psi(t)>$ is found after a single RF pulse of duration $t_p$ at a frequency $\omega_0$, can be written as a simple rotation of the original wave function around z, $|\Psi(t)>=e^{-iH_Q t/\hbar}e^{i I_z \theta}|\Psi(0)>$, where $\theta=\Omega_{10}t_p/2$. Similarly an RF pulse at the frequency $\omega_-$ is equivalent to a rotation about y by $\Omega_{1-}t_p/2$. Furthermore, the wave function after simultaneous irradiation at $\omega_-$ and $\omega_0$ can be shown to be equivalent to a rotation about an axis in the y-z plane, rotated from the z-axis by an angle $\xi$, where $\tan\xi=\Omega_{1-}/\Omega_{10}$. That is $|\Psi(t)>=e^{-iH_Q t/\hbar}e^{i(\cos\xi I_z+\sin\xi I_y)\theta}|\Psi(0)>$, where $\theta=\sqrt{(\Omega_{10}^2+\Omega_{1-}^2)}t_p/2$ is the angle of rotation defined by the effective RF-field generated by the two orthogonal RF fields. For notational simplicity, the above cases assume that all pulses are referenced to zero phase. The effect of including non-zero phases is simply the addition of the phases of the $\omega_-$ pulse and the $\omega_0$ pulse to the final phase of the signal.

Consider serial irradiation, where irradiation at the two frequencies occurs at different times. Using the above operators and starting from thermal equilibrium, it is found that a pulse of length $t_p^a$ at $\omega_-$ followed by a pulse of length $t_p^b$ at $\omega_0$ with a delay of $\tau$ between the pulses results in an expectation value oscillating at $\omega_+$ given by $$\langle I_x(t)\rangle = (N_0^0 - N_-^0)\sin(\Omega_{1-}t_p^a)\sin\left(\frac{\Omega_{10}t_p^b}{2}\right)\sin(\omega_+(t+t_p^b)+\omega_-(\tau+t_p^a)) \quad (3)$$

where t is the time after the end of the second pulse. $N_-^0$ and $N_0^0$ are the thermal populations of the eigenstates $|->$ and $|0>$, so that the amplitude of the signal depends on the initial difference in the populations connected by the first transition excited. Note that for a single crystal the maximum signal occurs when the first pulse induces a nutation angle of $\Omega_{1-}t_p^a=\pi/2$ and the second pulse has $\Omega_{10}t_p^b=\pi$, or for a crystal oriented for the most efficient excitation $\gamma_N B_{1-} t_p^a=\pi/2$ and $\gamma_N B_{10} t_p^b=\pi$. For a powder, the observed signal is proportional to the average over all possible crystal directions of the nuclear spin angular momentum projected along the axis of the detection coil. Usually no signal at $\omega_+$ is observed using receiver coils oriented in the x'-y' plane. With a detection coil along the z'-axis the signal is proportional to $$S_{z'} \propto \int_0^{2\pi} d\alpha \int_0^{\pi} d\beta\sin\beta \int_0^{2\pi} d\gamma \left(\cos\alpha\sin\beta\frac{d\langle I_x(\alpha,\beta,\gamma)\rangle}{dt}\right). \quad (4)$$

Performing the powder average numerically, it is found that the maximum attainable signal occurs when $\gamma_N B_{1-} t_p^a=2.13$ rad and $\gamma_N B_{10} t_p^b=4.26$ rad rather than $\pi/2$ and $\pi$ (the aligned single crystal results) because randomly oriented crystals will experience RF pulses reduced by the angular factors in $\Omega_{1-}$ and $\Omega_{10}$ (see Eq. 2). This behavior mimics that seen in single frequency NQR where the maximum signal for a powder occurs at a nutation angle of 2.08 rad, a third longer than the nutation angle needed ($\pi/2$) for a properly oriented single crystal. For a powder, the three-frequency maximum signal size is $$\frac{2(1-\eta/3)}{3(1+\eta/3)} = \frac{2\omega_-}{3\omega_+}$$

of the maximum signal of a single-frequency NQR experiment at $\omega_+$.

Similarly, simultaneous irradiation of the sample at $\omega_-$ and at $\omega_0$ results in an expectation value oscillating at $\omega_+$ such that $$\langle I_x(t)\rangle=\sin 2\xi(1-\cos\theta)\sin(\omega_+ t)\times[(N_0^0-N_+^0)(\cos^2\xi+\sin^2\xi\cos\theta)-(N_-^0-N_+^0)(1+\cos\theta)]. \quad (5)$$

From examination of the geometrical terms, a maximum signal for a single crystal occurs when $\xi=\pi/8$ and $\theta=\pi$, or for a crystal oriented for the most efficient excitation $B_{1-}/B_{10}=\tan(\pi/8)$ and $\gamma_N B_{10} t_p=2\pi\cos(\pi/8)$. Using $<I_x(t)>$ of Eqn. 5, numerically integrate to find the powder-averaged signal in the detection coil oriented along z'. Again no signal at $\omega_+$ is observed using receiver coils oriented in the x'-y' plane. Although the signal is dependent in a complicated manner on the thermal populations, and therefore $\eta$, the parameters which give a maximum signal depend only slightly on $\eta(B_{1-}/B_{10}\approx\tan(\pi/8)$ and $\gamma_N B_{10} t_p\approx 7.6$ rad, approximately a third longer than $2\pi\cos(\pi/8)$). The maximum signal ranges from 67% to 53% ($0<\eta<1$) of the corresponding maximum signal for a single-frequency experiment at $\omega_+$.

In practice, there is a small distribution of quadrupole interactions within the sample so that $H_Q=H_Q^0+\Delta H_Q$. A second simultaneous pulse applied at time $\tau$ after an initial simultaneous pulse can undo the dephasing caused by this distribution so that a spin-echo is formed at a time $t=\tau$ after the end of the second pulse (see FIG. 5). Assuming $\Delta H_Q$ is small enough that it has a negligible effect on the time evolution during applied pulses (i.e., $\Delta H_Q \ll H_{1-}, H_{10}$), it is found $|\Psi(t)\rangle = e^{-iH_Q 0(t+t_p b \tau+t_p a)/\hbar} e^{-i\Delta H_Q t/\hbar} e^{iK^b} e^{-i\Delta H_Q \tau/\hbar} e^{iK^a} |\Psi(0)\rangle$, where $K^a = (\cos \xi^a I_x + \sin \xi^a I_y) \theta^a$ corresponds to the first simultaneous pulse of length $t_p^a$ and $K^b = (\cos \xi^b I_x + \sin \xi^b I_y) \theta^b$ to the second pulse of length $t_p^b$. The refocused signal at $\omega_+$ is then $$\langle I_x(t) \rangle = -\sin 2\mu^a (1-\cos\theta^a)\sin(\omega_+(t+t_p^b+\tau+t_p^a)+\Delta\omega_+(t-\tau)+2\Delta\phi) \times$$
$$[(N_0^0 - N_+^0)(\cos^2\xi^a + \sin^2\xi^a \cos\theta^a) -$$

$$(N_-^0 - N_+^0)(1+\cos\theta^a)] \times \sin^2\xi^b \cos^2\xi^b (1-\cos\theta^b)^2 \quad (6)$$

where $\Delta\omega_+$ describes the distribution in $\omega_+$ and $\Delta\phi \equiv \Delta\phi + \Delta\phi_0$. ($\Delta\phi$ is the phase difference between the first and second pulse of $\omega_-$ and $\Delta\phi_0$ the phase difference for the $\omega_0$ pulses.) For a single crystal, the distribution due to $\Delta H_Q$ is completely refocused and the largest echo occurs when $\xi^a = \pi/8$, $\xi^b = \pi/4$, and $\theta^a = \theta^b = \pi$ (or for a crystal oriented for the most efficient excitation $\gamma_N B^a_{10} t_p^a = 2\pi \cos(\pi/8)$, $\gamma_N B^b_{10} t_p^b = 2\pi \cos(\pi/4)$). Through numerical integration, it is found that for a powder the echo is a maximum when $B^a_{1-}/B^a_{10} \approx \tan(\pi/8)$, $B^b_{1-}/B^b_{10} \approx \tan(\pi/4)$, $\gamma_N B^a_{10} t_p^a \approx 7.4$ rad, and $\gamma_N B^b_{10} t_p^b = 5.7$ rad. The maximum signal ranges from 48% to 41% ($0<\eta<1$) of the corresponding maximum signal for a single-frequency resonant experiment at $\omega_+$, or approximately 75% of the signal following the first pulse is refocused for a powder sample. When deriving Eqn. (6) there are several terms not included that depend on the precise nature of the quadrupole field distribution and may give rise to echoes at times other than at $t=\tau$, as discussed by Grechishkin.

SUMMARY OF THE INVENTION

The three eigenstates for spin-1 nuclei under a quadrupolar Hamiltonian and the corresponding three possible transition frequencies are shown in FIG. 1. In conventional NQR, only one of those transitions is irradiated. The resulting nuclear magnetization oscillates at the frequency of the irradiated transition and is observed. Three-frequency NQR involves excitation of at least two transitions that causes an observed signal at the third transition frequency. Two transitions are irradiated to create an oscillating signal from the third. Similar techniques have been used in NMR to create multiple-quantum coherence, but there the excited transition is forbidden and not directly observable at its own frequency.

The ability to detect a signal at a frequency different from the irradiation frequency gives three-frequency NQR some important potential advantages over single-frequency NQR. Interfering signals from resonant acoustic ringing (magnetostriction) of certain metals at the irradiation frequency could be eliminated. In addition the receiver dead-time, the time after sample irradiation in which the receiver's response to the transmitted pulses obscures the initial NQR signal, should be reduced since no RF energy is applied at the frequency of the receiver. This reduction of dead-time would be especially important for those materials in which the free induction time ($T_2^*$) is short.

It is an object of the present invention to provide a multiple-frequency technique of nuclear quadrupole resonance.

A further object of the present invention is to provide a system for detecting explosives and narcotics by nuclear quadrupole resonance.

Additional objects and advantages of the invention will be set forth in the description which follows, and, in part, will be obvious from the description, or may be learned by practice of the invention.

Objects of the present invention are achieved by using two frequencies to excite the third transition, and then to detect the signal from this third transition. This avoids any interference from acoustic ringing since the RF magnetic field is not applied at the frequency that is detected. The method disclosed here involves the direct observation of a NQR transition near a frequency that has not been used for irradiation.

BRIEF DESCRIPTION OF THE DRAWINGS

The present invention will become more fully understood from the detailed description given herein and the accompanying drawings which are given by way of illustration only, and thus are not limitative of the present invention and wherein.

DESCRIPTION OF THE PREFERRED EMBODIMENTS

Figure 1:
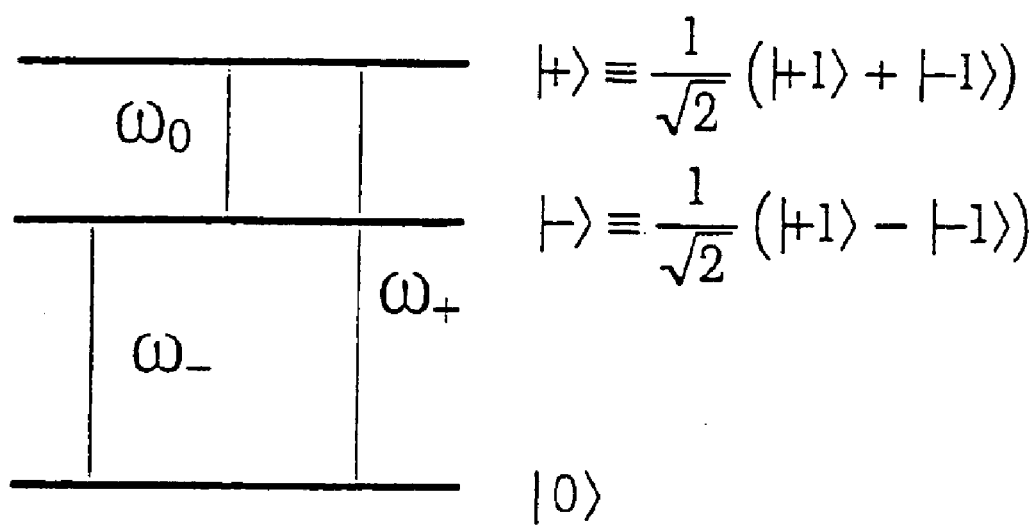
FIG. 1 illustrates energy levels determined by a quadrupolar Hamiltonian of nuclear spin I=1.

Reference will now be made in detail to the present preferred embodiments of the present invention, examples of which are illustrated in the accompanying drawings, wherein like reference numerals refer to like elements throughout.

This invention provides a means for exciting and detecting three-frequency pulsed nuclear quadrupole resonance (NQR). One of the main applications is in explosives and contraband detection by NQR. For example, the three-frequency technique helps to reduce the receiver dead time in an NQR measurement, which can be particularly important if a very high-Q receiver coil is used. In addition, the three-frequency technique provides an even more materialspecific signature than a single-frequency NQR technique. In general, the three-frequency technique, as an extension of traditional NQR, is also useful in some circumstances to better study the behavior and properties of certain materials. It is also noted that the three-frequency technique with a known and appropriate material present can be used as a simple logic gate since the signal at the third frequency is only observed if both of the two excitation frequencies are present.

For a spin-1 nucleus such as $^{14}$N, there are three distinct transition frequencies as shown in FIG. 1. It is important to note that in order to use a multiple-frequency technique, the nucleus to be examined should have asymmetry parameter η not equal to 0 or 1, for which the three energy levels are distinct. Fortunately, the $^{14}$N found in many explosives has a large asymmetry parameter. As an example, for RDX, η=0.62 and the NQR resonant frequencies are $\upsilon_+$=5.2 MHz, $\upsilon_-$=3.4 MHz, and $\upsilon_0$=1.8 MHz.

A major aspect here is the use of simultaneous excitation at two frequencies to create the desired signal at a third frequency, and also the method and techniques for the creation of spin echoes and other signals analogous to those obtained with standard multipulse single-frequency NQR methods. Echoes, for example, are highly advantageous for increasing the signal-to-noise ratio per unit time and thereby improving the detection. Multiple echos, such as in the spin-lock spin echo (SLSE) sequence, are a common way to significantly decrease the acquisition times for weak signals.

Separating the excitation frequencies from the detection frequency allows the use of low Q transmitter coils to produce large bandwidth pulses while using a high Q detector coil. This will be an advantage in super-Q detection of broad lines.

Figure 2:
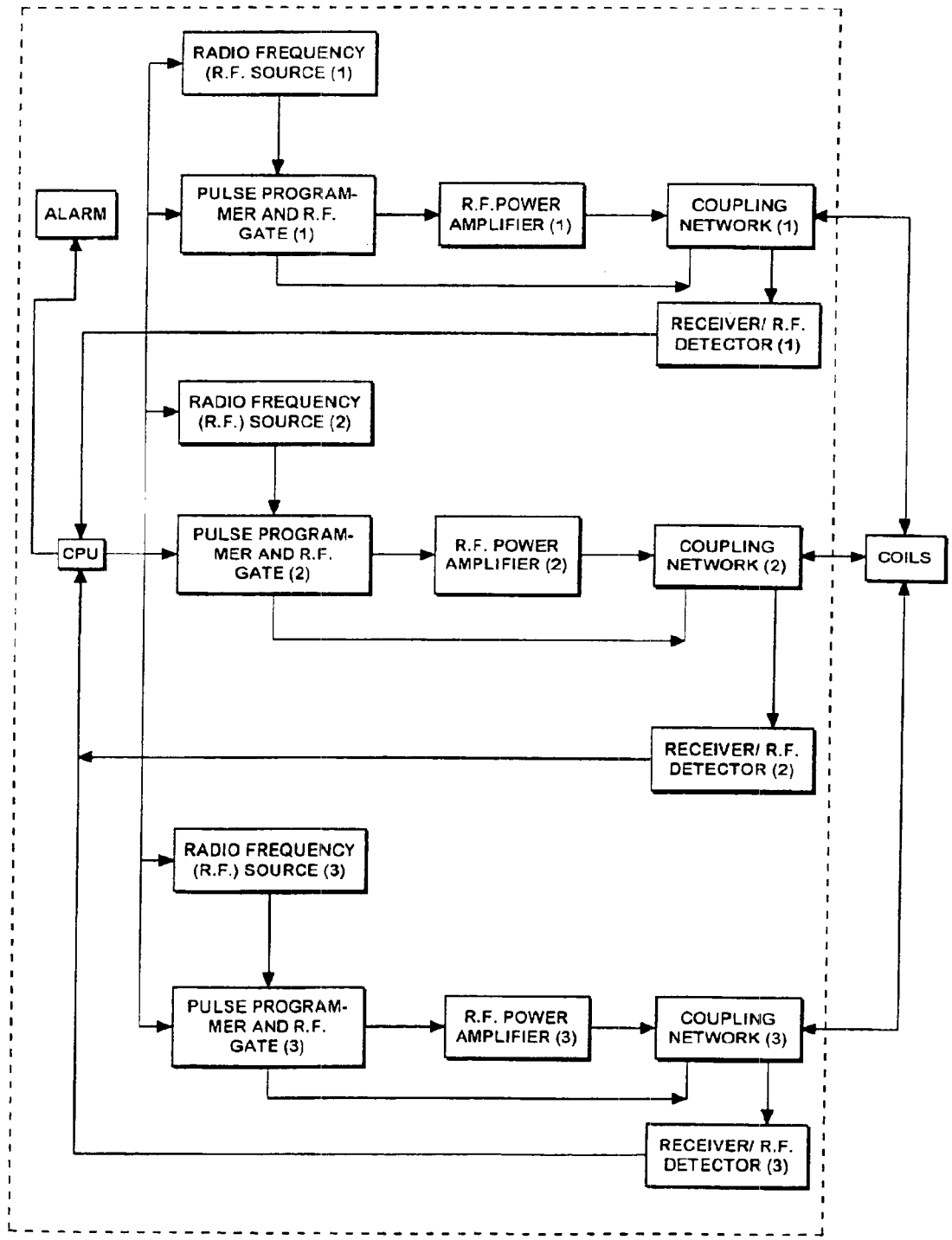
FIG. 2 illustrates a block diagram of the NQR system for the present invention.

FIG. 2 shows a block diagram for the NQR detection system for a preferred embodiment of the present invention. The RF source (1), the pulse programmer and RF gate (1) and an RF power amplifier (1) are provided to generate a train of RF pulses having a frequency corresponding to one of the three NQR transition frequencies of the type of explosive (e.g., all RDX-based explosives) or narcotic desired to be detected. The coupling network (1) conveys this train of RF pulses to the irradiating and detecting means (typically a coil). Similarly, the RF source (2), the pulse programmer and RF gate (2) and RF power amplifier (2) are provided to generate a train of RF pulses having a frequency corresponding to a second frequency of the three NQR transition frequencies. The coupling network (2) conveys this train of RF pulses to the irradiating and detecting means (typically a second coil). Likewise, the RF source (3), the pulse programmer and RF gate (3) and RF power amplifier (3) are provided to generate a train of RF pulses having a frequency corresponding to the third frequency of the three NQR transition frequencies. A coupling network (3) conveys this train of RF pulses to a third irradiating and detecting means (typically a third coil). The coupling networks ((1), (2), and (3)) also conduct the signal to the receiver/RF detectors ((1), (2), and (3)) from the coils while a specimen is irradiated with the train of RF pulses from all three sources. A central processing unit (CPU) controls the RF sources and the pulse programmers and RF gates. The CPU also processes the data and compares the NQR signal with a predetermined threshold value. When the predetermined threshold value is exceeded, an optional alarm is activated in response to the comparison by the CPU. The receiver/RF detectors, the RF power amplifiers, the pulse programmers and RF gates, the RF sources, and the CPU and the alarm may be contained in a console with only the coil and the coupling networks being outside of the console. The embodiment shown is one of the most general possible applications of three-frequency NQR.

Although in this embodiment the same means is used for both irradiating the sample with the excitation radiation and detecting the NQR signal (e.g., one coil is used for both functions), this is not a requirement of the invention. Separate irradiation and detection means (e.g., separate irradiation and detection coils) may be employed if desired. For simplicity, common transmitter and receiver coils are used for each frequency in the three-frequency NQR, though separate sets of coils could be employed.

The free induction decay curve is a time domain curve. By performing a Fourier transform on this curve, a frequency domain NQR spectrum of the target species may be obtained.

Although a few preferred embodiments of the present invention have been shown and described, it would be appreciated by those skilled in the art that changes may be made in these embodiments without departing from the principles and spirit of the invention, the scope of which is defined in the claims and their equivalents.

The technique utilized according to the present invention is pure nuclear quadrupolar resonance as taught in the previously mentioned Buess et al. patent. Three frequency excitation and detection may be performed by combinations of any means known in the art, for example, a surface coil, such as a meanderline coil or a more conventional 'volume' coil such as a cylindrical or rectangular solenoid, a toroid, or a Helmholtz coil. Pure NQR is typically performed in zero magnetic field: no magnet is required.

Obviously, many modifications and variations of the present invention are possible in light of the above teachings. It is therefore to be understood that, within the scope of the claims, the invention may be practiced otherwise than as specifically described.

EXAMPLES

Figure 3:
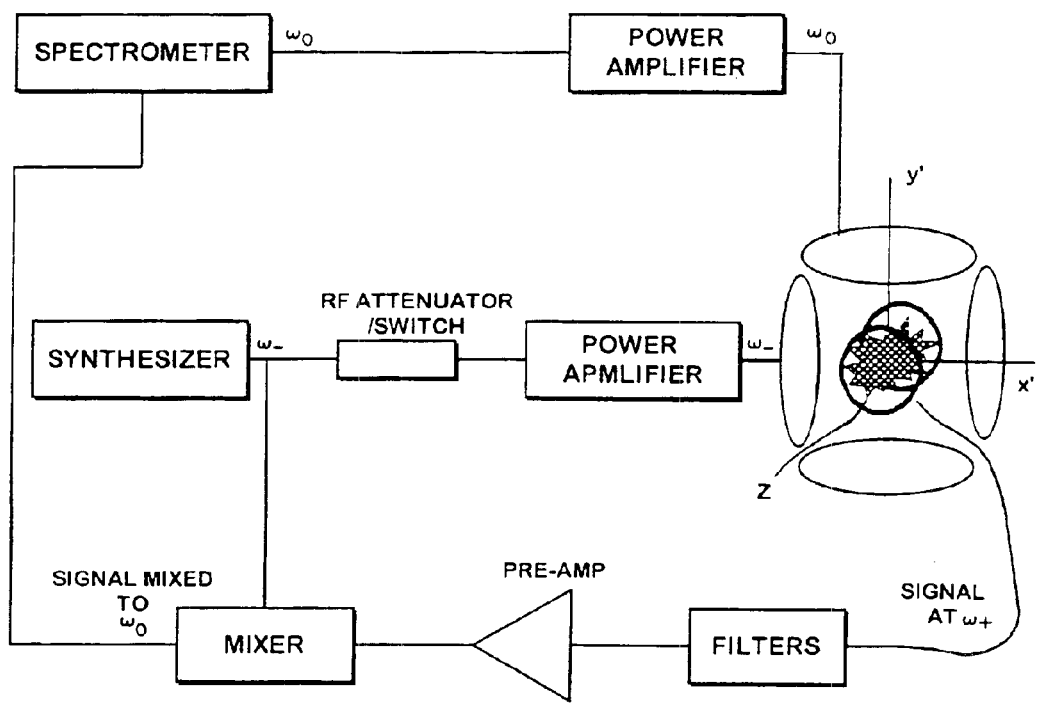
FIG. 3 illustrates a schematic of the three-frequency NQR system.

The experiment was carried out using $^{14}$N nuclei in a powder sample of sodium nitrite, $NaNO_2$, at room temperature. Given sodium nitrite's asymmetry parameter of η=0.379, the level spacing is unequal and the transition frequencies are distinct ($\omega_+/2\pi$=4.64 MHz, $\omega_-/2\pi$=3.60 MHz, and $\omega_0/2\pi$=1.04 MHz). The 8 gm sample was placed at the center of a probe having three mutually orthogonal pairs of coils (see FIG. 3). RF pulses at $\omega_0$ were produced by a Tecmag spectrometer, suitably amplified, and coupled into a Helmholtz coil oriented along y', RF pulses at $\omega_-$ were produced by a frequency generator and coupled to a Helmholtz coil oriented along x', and the third pair of coils oriented along z' was used to detect the signal at $\omega_+$. The strengths of the RF magnetic fields were measured using a small pick-up coil; $B_1$s as large as 2 mT were used for this experiment. It was shown that indirect mixing of the frequencies resulted in only a negligible RF pulse at $\omega_+$ ($B_{1+}$<1 μT).

Each set of coils was parallel tuned to the appropriate NQR frequency using variable capacitors. This frequency-selective tuning and the coils' mutual orthogonality provide more than 25 dB of isolation between the transmit and receiver coils so that RF leakage of $\omega_-$ and $\omega_0$ at the $\omega_+$ receiver probe is significantly reduced. The RF leakage of $\omega_-$ and $\omega_0$ reaching the preamplifier is further reduced by analog filters. Therefore the dead-time could be significantly reduced. Receiver dead-times as low as 70 μs were observed, approximately five times smaller than typical dead-times seen in single-frequency experiments.

After filtering, the NQR signal at $\omega_+$ is heterodyned to $\omega_0$ by mixing with RF from the $\omega_-$ frequency synthesizer (see FIG. 3) so that the random phase introduced by the pulse at $\omega_-$ is removed. The NQR spectrometer then operates normally to detect the signal at $\omega_0$, and all modifications are external to the spectrometer. Approximately 120 measurements were conducted using simple phase cycling to remove undesired transients after the RF pulses.

Figure 4:
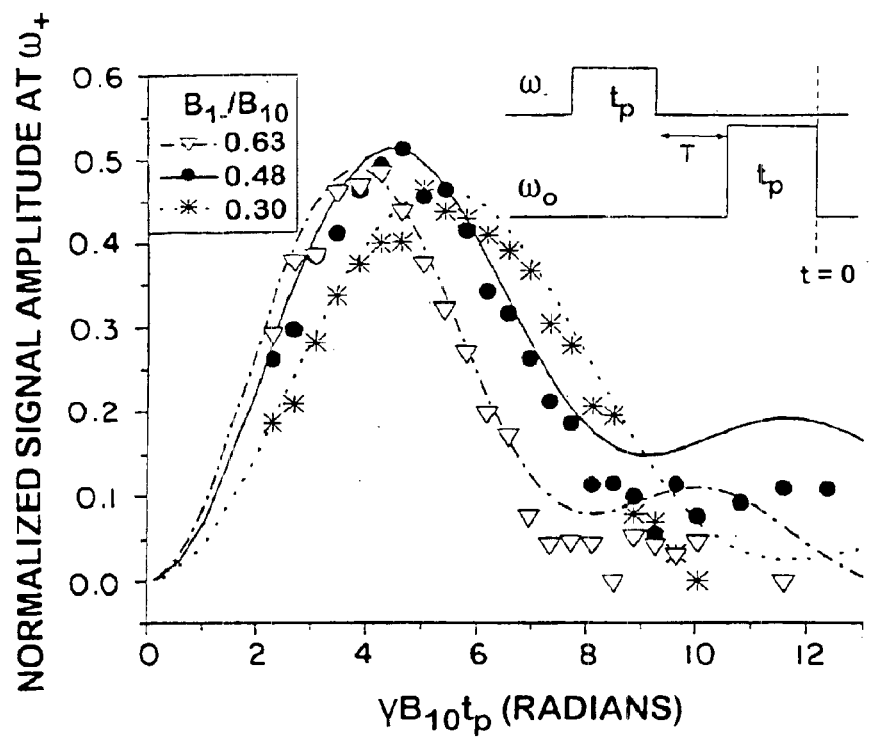
FIG. 4 illustrates the dependence of the three-frequency NQR signal of a powder of sodium nitrite at $\omega_+$ on the nutation angle, $\gamma_N B_{10} t_p$, for the serial pulse sequence shown in the inset ($\tau=0$).

FIG. 4 shows the peak amplitudes from the Fourier transform of the free induction decay (FID) at $\omega_+$ in response to irradiation of the sample first by $\omega_-$, immediately followed by a pulse of the same length at $\omega_0$. The nutation angles on the horizontal axis correspond to a constant $B_{10}$ and variation in pulse length between 50 and 300 $\mu$s. To first approximation, the relaxation occurring during the pulses was taken into account by considering the signal at the same time after the beginning of the second pulse. Also shown in FIG. 4 are the corresponding theoretical predications using the independently measured fields $B_{10}$ and $B_{1-}$, and the sensitivity of the receiver coil as determined by a single-frequency NQR experiment at $\omega_+$. (There are no adjustable parameters.) Although the data agree fairly well with theoretical prediction for smaller nutation angles ($\gamma_N B_{10} t_p < 2\pi$), they deviate for larger nutation angles.

Figure 5:
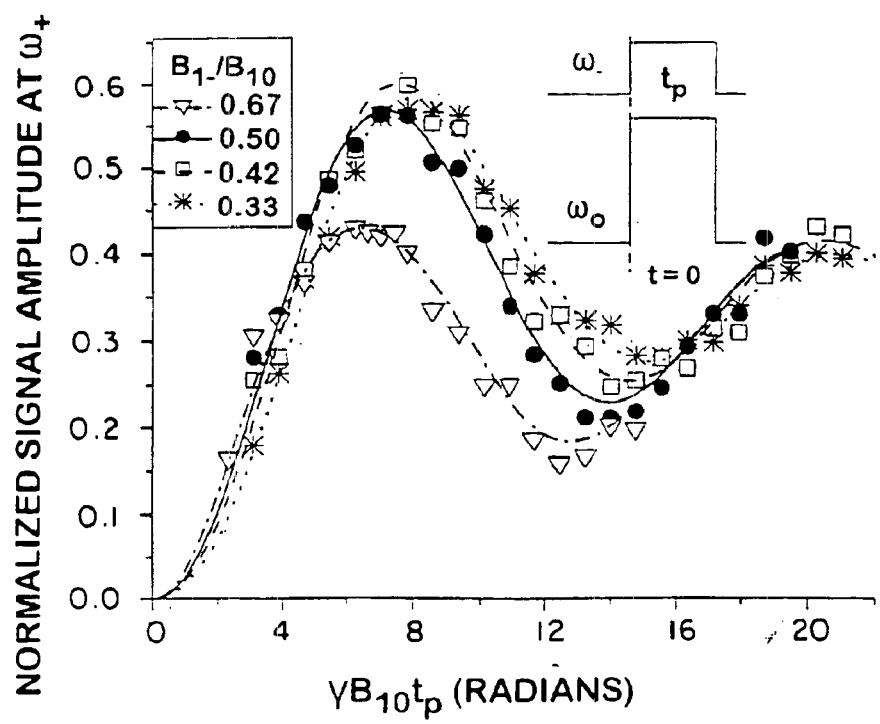
FIG. 5 illustrates the dependence of the three-frequency NQR signal at $\omega_+$ on the nutation angle $\gamma_N B_{10} t_p$ for the simultaneous pulse sequence shown in the inset.

The amplitudes of the NQR signals at $\omega_+$ in response to simultaneous irradiation of the sample by RF pulses at $\omega_0$ and $\omega_-$ agree well with theoretical predications over the entire range of nutation angles studied. The symbols in FIG. 5 correspond to signals taken at the same time after the center of the pulse, in order to take into the account relaxation occurring during the pulse length (60 to 500 $\mu$s). By varying the values of the magnetic fields $B_{10}$ and $B_{1-}$ we fit theoretical predictions to the experimental data. The best fits, shown as curves in FIG. 5, correspond to magnetic field strengths approximately 6% higher than measured values, well within experimental error bars.

Figure 6:
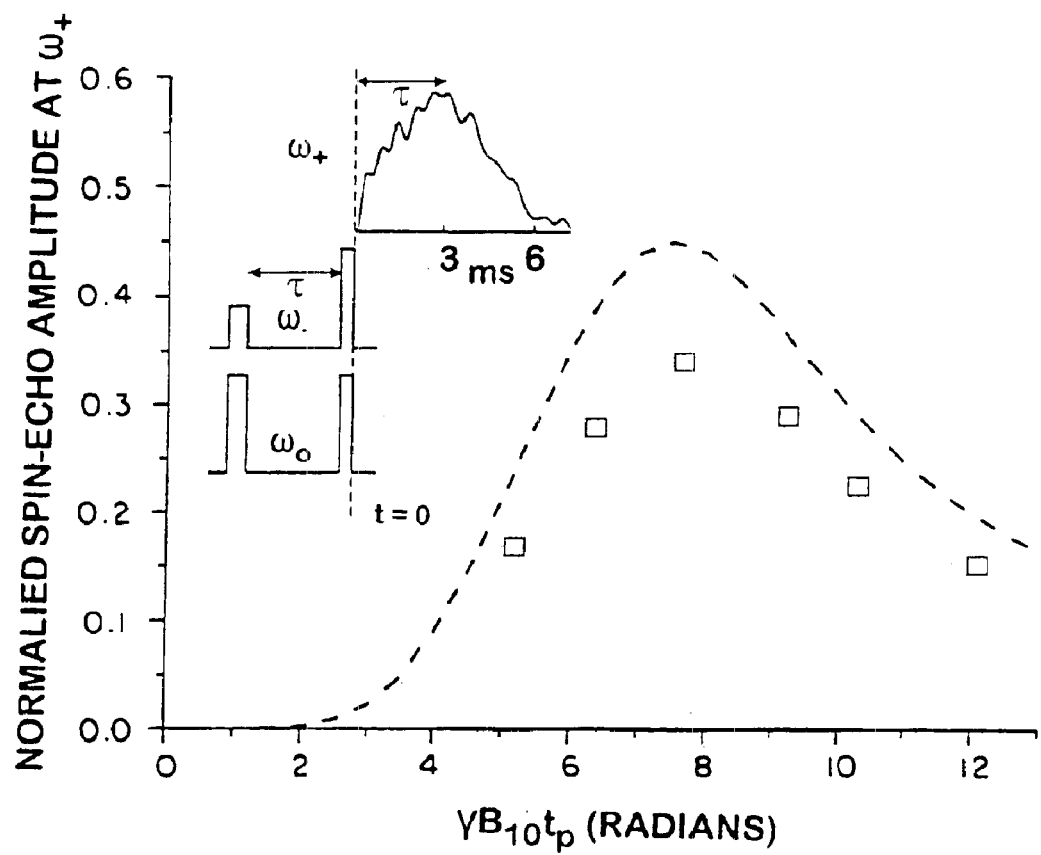
FIG. 6 illustrates the observed three-frequency spin-echo signal (symbols) as a function of the nutation angle $\gamma_N B^a_{10} t_p^a$ for the parameters given.

For a pair of simultaneous pulses separated by time $\tau$, we observed a spin-echo around $t=\tau$ after the end of the second pulse; see the inset of FIG. 6. Phase cycling eliminated the FID from the second pulse. The signal from $t=\tau$ onwards was Fourier transformed to compare it to a single-frequency experiment. The vertical axis in FIG. 6, was normalized to the maximum FID signal for a single-frequency experiment at $\omega_+$. For a given pair of pulses $\tau$ was varied (from 5 ms down to less than 0.5 ms) and the signal amplitude was extrapolated back to $\tau=0$ using a linear fit to the data. A linear fit seems to characterize the data well. The extrapolated amplitudes corresponding to $\tau=0$ are plotted as squares in FIG. 6 as a function of nutation angle $\gamma_N B_{10} t_p^a$ ($t_p^a$ ranges from 180 to 420 $\mu$s for FIG. 6 data). For this data the ratios of $B_1$s for the two sets of pulses were governed by $B^a_{1-}/B^a_{10}=\tan(\pi/8)$, $B^b_{1-}/B^b_{10}=\tan(\pi/4)$, and $t_p^b \sqrt{B_{10b^2}+B_{1-b^2}}=t_p^a \sqrt{B_{10a^2}+B_{1-a^2}}$. As can be seen in FIG. 6, the theoretical predictions of the spin-echo amplitude are in reasonable agreement with experimental measurements for these optimal parameters.

Figure 7A:
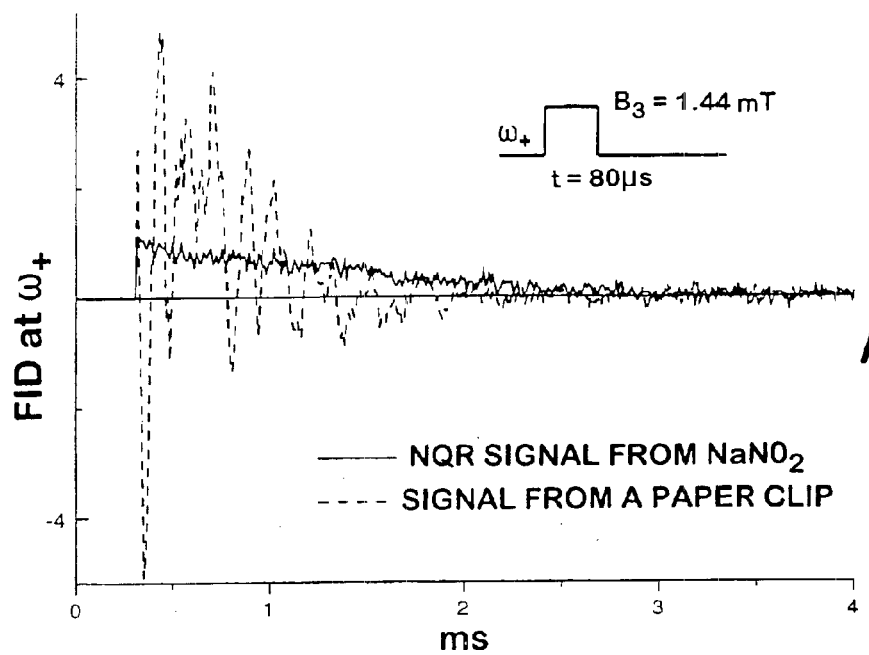
FIGS. 7A & 7B illustrate the problem of acoustic ringing for single-frequency irradiation.
Figure 7B:
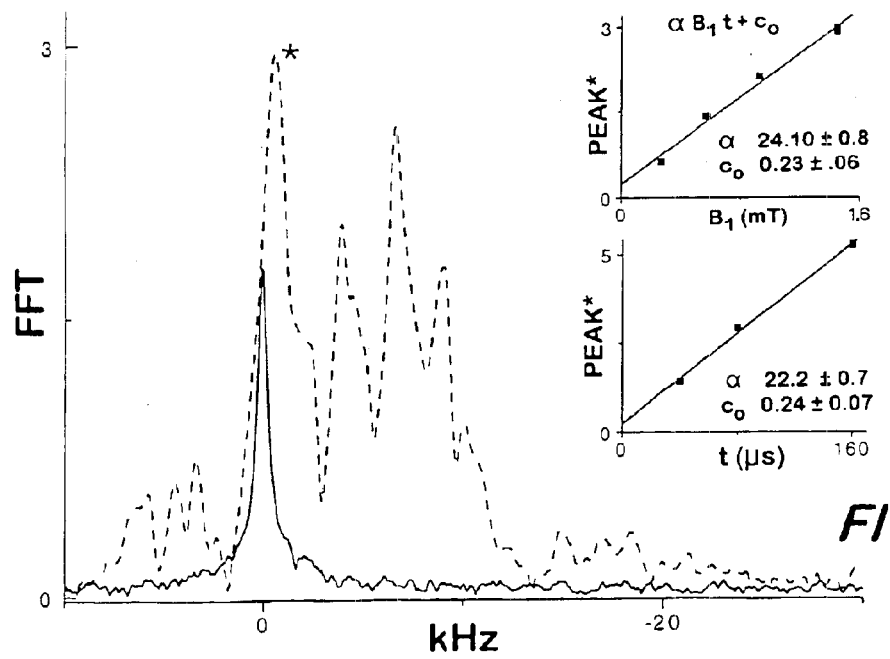

The oscillating magnetic field of the RF pulse produces small changes in the physical dimensions of ferromagnetic materials (acoustic ringing) and conversely, these physical deformations produce changes of magnetization in the material which can then be detected as an artificial signal. The dashed line of FIG. 7A shows the resulting response from a magnetized paper clip to a single-frequency pulse at $\omega_+/2\pi=$ 4.64 MHz. For comparison, the response of an 8 g sample of sodium nitrite $NaNO_2$ to the same pulse is shown as a solid line. Following the same peak in frequency space (designated by a star FIG. 7B) it was observed that the response of the paper clip to the RF pulse is linear both in the RF field strength and in the duration of the pulse, for pulse widths short compared to the time constant of the acoustic ringing, here ca 1 ms.

Figure 8A:
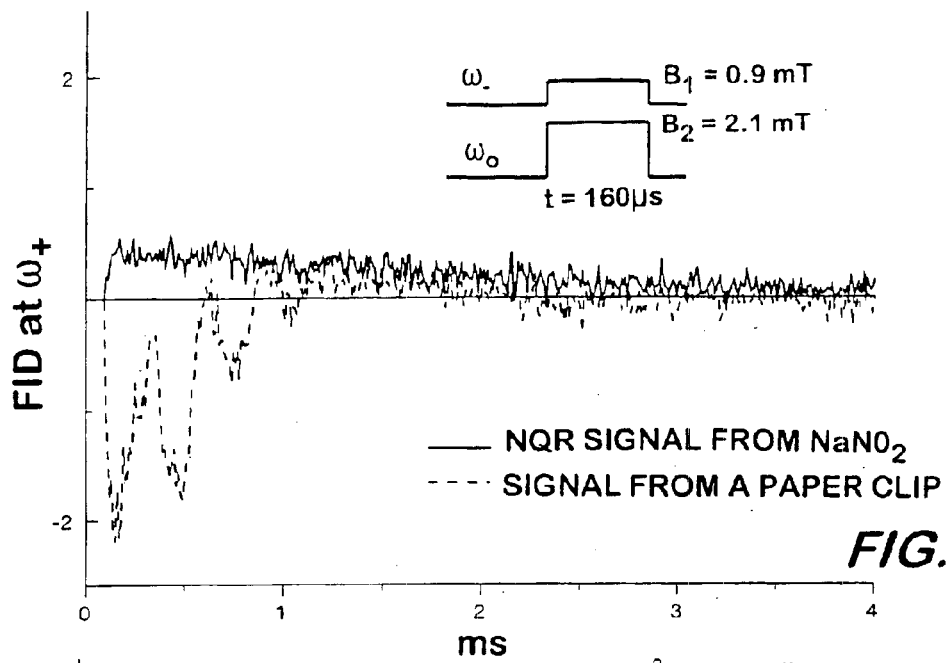
FIGS. 8A & 8B illustrate the problem of acoustic ringing for simultaneous irradiation.
Figure 8B:
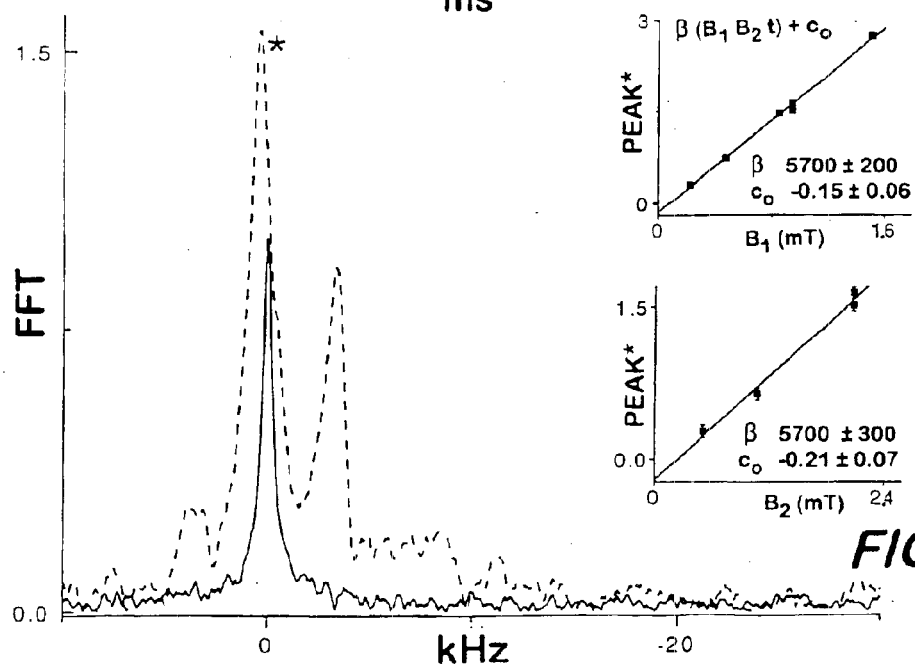
Figure 9A:
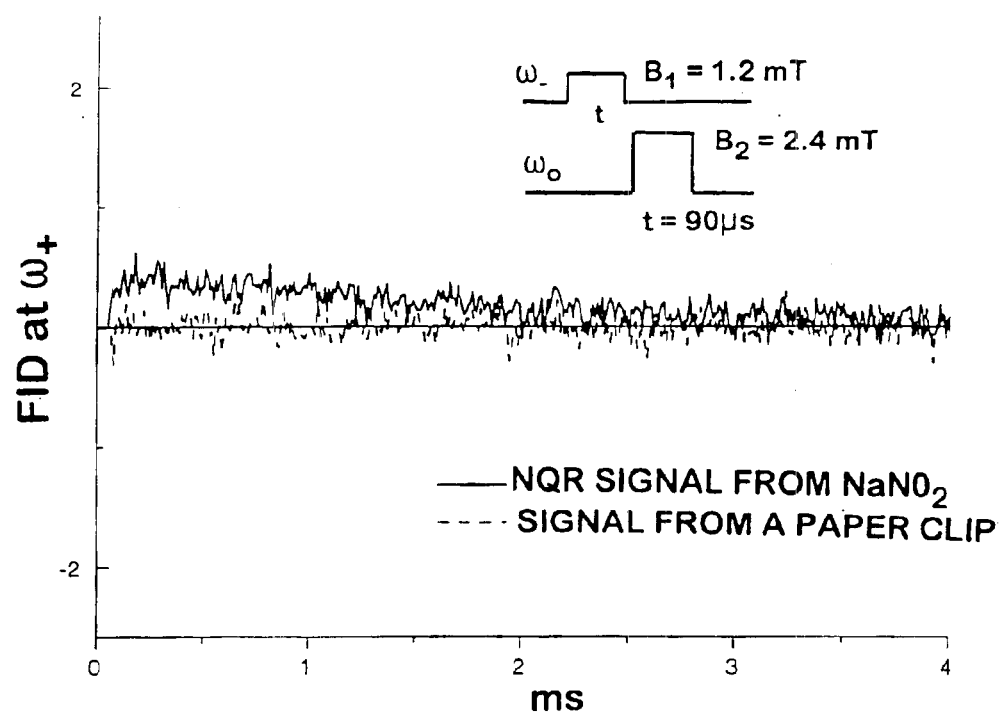
FIGS. 9A & 9B illustrate the elimination of acoustic ringing for serial irradiation.
Figure 9B:
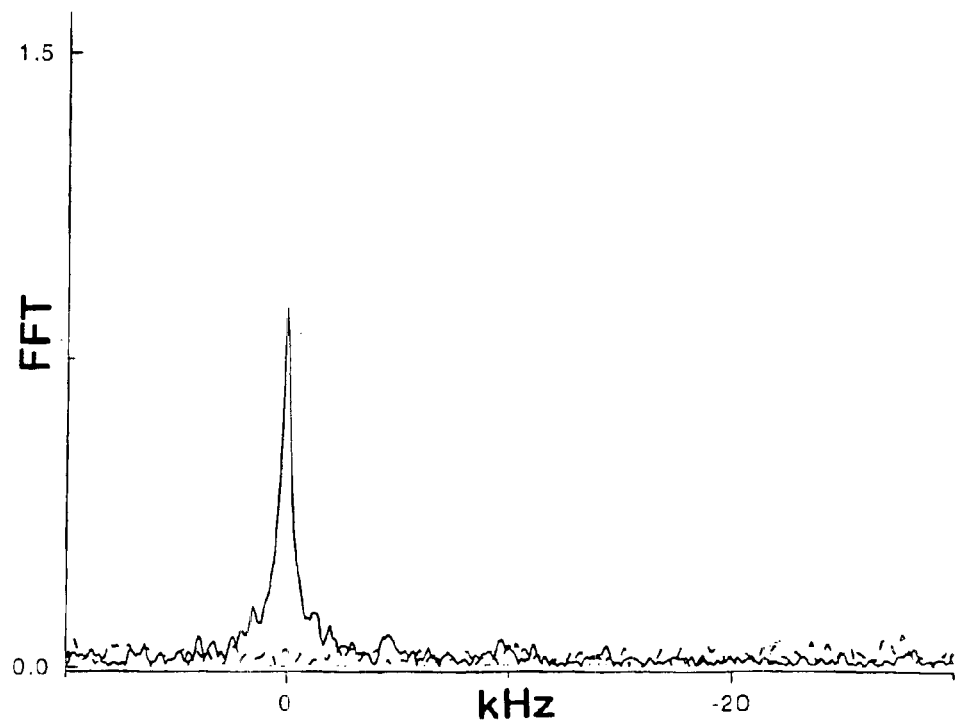

For simultaneous irradiation of the paperclip with the two frequencies $\omega_-$ and $\omega_0$ (3.60 M and 1.04 MHz) a surprisingly strong acoustic ringing signal was observed at $\omega_+$ as shown by the dotted line of FIGS. 8A and 8B. However, for serial irradiation of the same paperclip first with $\omega_-$ then with $\omega_0$ no acoustic ringing at $\omega_+$ was observed as shown in FIGS. 9A and 9B. The pulse parameters used in FIGS. 8A, 8B, 9A, 9B are close to the optimum needed for an NQR signal for each sequence (the NQR signals are shown as solid lines). The fact that the acoustic ringing at $\omega_+$ appears for simultaneous, not for serial irradiation, implies that the deformation of the paperclip in response to the oscillating magnetic field contains a large nonlinear component. The response from the paperclip was linear in the duration of the simultaneous pulse (not shown) and in the two field strengths $B_1$ and $B_2$ (shown in FIG. 8B). This suggests that the nonlinear component is proportional to the square of the total magnetic fields. Therefore the use of serial irradiation of the sample with $\omega_-$ and $\omega_0$ and detection at $\omega_+$ looks like a promising means to detect a $^{14}$N NQR signal, without interference from acoustic ringing. Furthermore, as shown in FIG. 8A and FIG. 9A, the receiver dead time is significantly reduced over that of a single-frequency experiment.

Figure 10A:
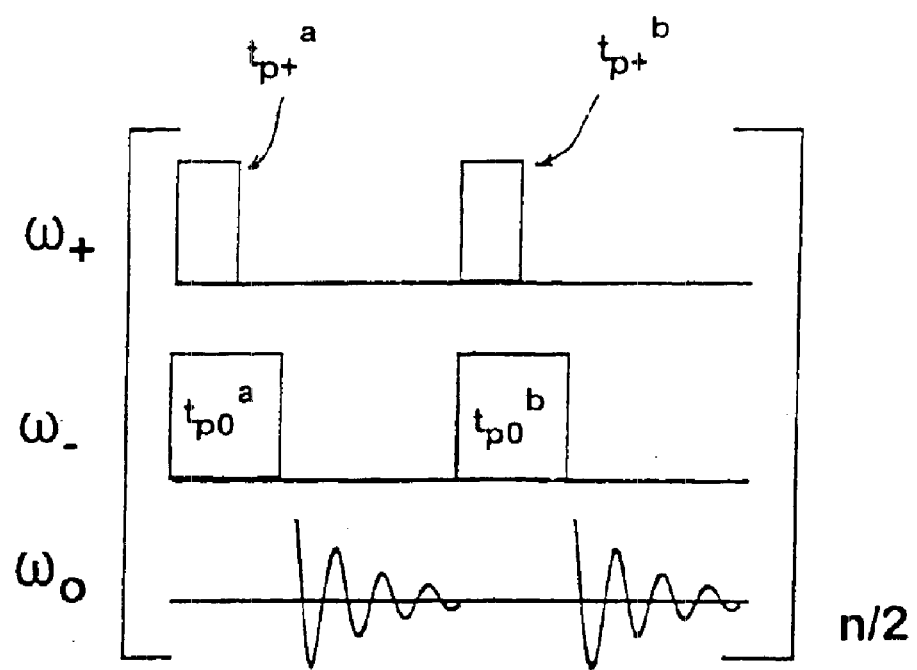
FIGS. 10A & 10B illustrate steady-state pulse sequences for simultaneous (FIG. 10A) and sequential (FIG. 10B) pulse irradiation. The sequences are repeated for a total of n signal acquisitions.
Figure 10B:
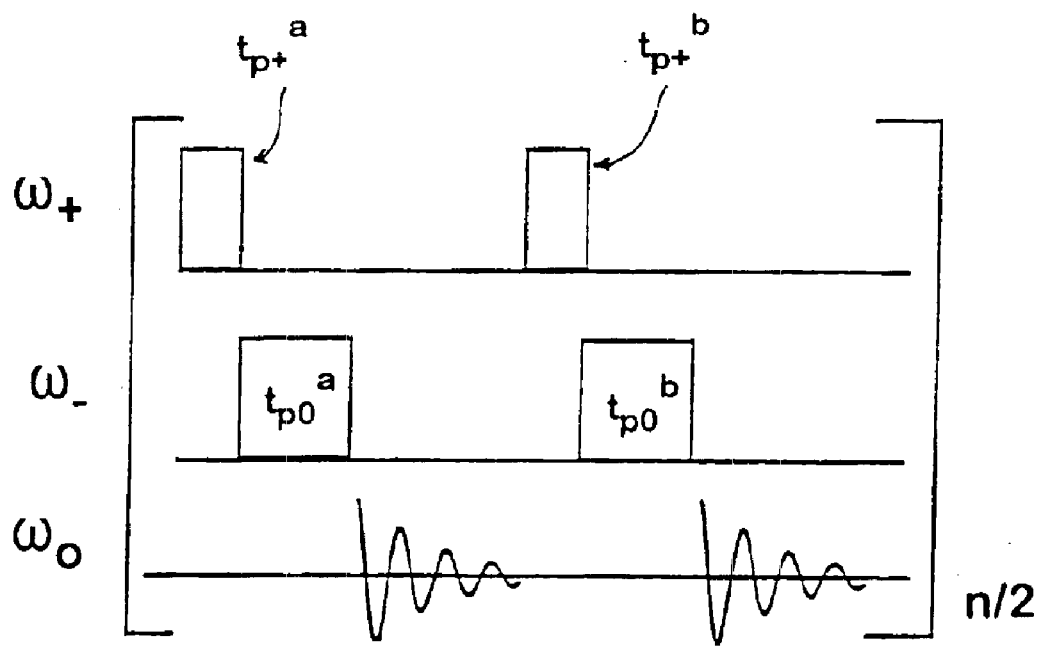
Figure 11A:
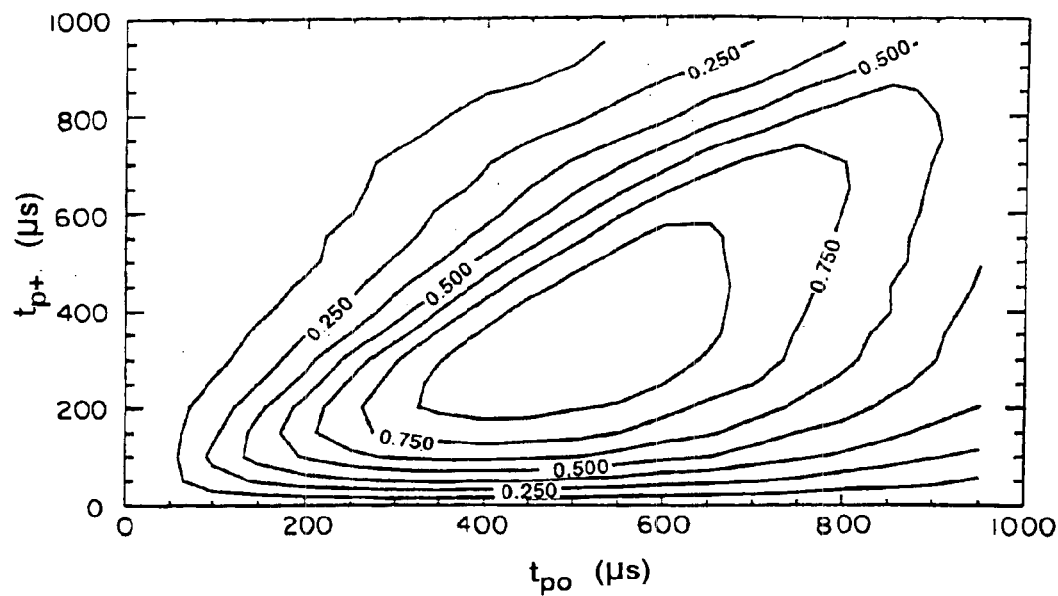
FIGS. 11A & 11B illustrate relative SNR as functions of excitation pulse widths for simultaneous (FIG. 11A) sequential (FIG. 11B) pulse irradiation where $t_{p+}$ are the pulse widths at 5.19 MHz and $t_{p0}$ are the pulse widths at 1.78 MHz. The sample is RDX.
Figure 11B:
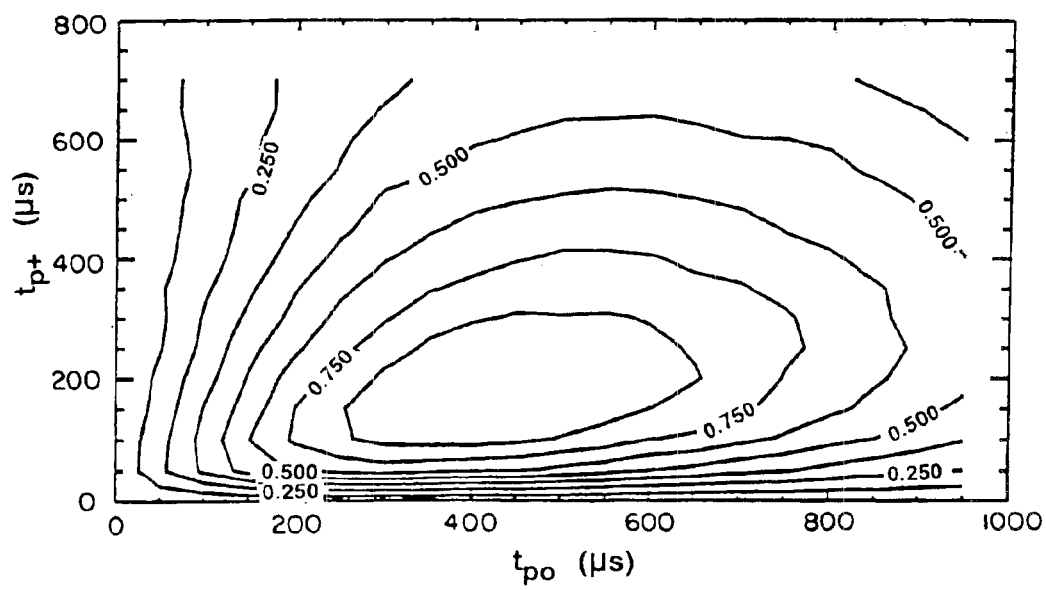

In order to increase SNR, multiple pulse sequences were used where RF pulses are applied in a time scale that is shorter than the time required for the spin system to return to equilibrium. Application of such steady-state pulse sequence with the three frequency NQR method has been demonstrated using RDX as the sample. As in the single excitation case, both simultaneous and sequential irradiation was tested. The pulse sequences are shown in FIGS. 10A & 10B. The RF excitation used frequencies $\omega_+/2\pi=5.19$ MHz, $\omega_0/2\pi=1.78$ and detection was at $\omega/2\pi=3.41$ MHz. The excitation and data acquisitions were repeated for a total of n times and the resulting signals from the pulses were averaged together. Different combinations on non-alternating and alternating RF phases of 0 and $\pi$ were used for the pulse pairs of $t_{p+}^a$, $t_{p+}^b$, and $t_{p0}^a$, $t_{p0}^b$ with the best on-resonance SNR obtained using non-phase alternating pulses. Using excitation RF fields of $B_{1+}=0.26$ mT and $B_{10}=0.28$ mT, signal amplitudes were obtained as functions of the excitation pulse widths. The resulting 2-dimensional plots of the relative SNR are shown in FIGS. 11A & 11B. Using the optimized pulse widths for the simultaneous and sequential excitation sequences, statistical measurements using a repetition of 200 experiments using identical pulse parameters showed simultaneous excitation to have SNR per unit time approximately two times larger than the sequentially excited sequence, and the overall sensitivity is comparable to conventional single frequency multiple pulse sequences used for detection of $^{14}$NNQR signal in RDX.

What is claimed is:

1. An apparatus, comprising:
   a device for irradiating a specimen with a first radio frequency pulse along an x-axis and a second radio frequency pulse along a distinct y-axis and receiving along a distinct z-axis a signal from said specimen in response to said irradiation, wherein said radio frequency pulses and said signal are defined by the nuclear quadrupole resonance frequencies of the nucleus being examined, wherein said first and second radio frequency pulses have different frequencies, and wherein said signal is received at a third frequency.

2. An apparatus as in claim 1, further comprising:
(a) a unit for comparing said signal to a predetermined threshold value; and
(b) an alarm for signaling when said signal exceeds said predetermined value.

3. An apparatus as in claim 1, wherein said x-axis, y-axis, and z-axis are orthogonal.

4. An apparatus as in claim 1, wherein said first and second radio frequency pulses are near to $^{14}$N nuclear quadrupole resonance frequencies of a predetermined type of explosive or narcotic to be detected.

5. An apparatus as in claim 4, wherein said predetermined type of explosive or narcotic to be detected comprises RDX-based explosives, HMX, PETN, TNT, ammonium nitrate, potassium nitrate, cocaine, and heroin.

6. An apparatus for examining a specimen by nuclear quadrupole resonance, comprising:
(a) a first generator for generating a first radio frequency pulse having a first predetermined frequency and a first radio frequency magnetic field;
(b) a first device for irradiating a specimen with said first radio frequency pulse and said first radio frequency magnetic field;
(c) a second generator for generating a second radio frequency pulse having a second predetermined frequency and a second radio frequency magnetic field;
(d) a second device for irradiating said specimen with said second radio frequency pulse and said second radio frequency magnetic field; and
(e) a detector for detecting a signal from said specimen in response to irradiating said specimen, wherein said radio frequency pulses are determined by the nuclear quadrupole resonance frequencies of the nucleus being examined, and wherein said first and second radio frequency pulses have different frequencies and wherein said signal is received at a third frequency and said first device is a first coil about an x-axis for irradiating said specimen about said x-axis and said second device is a second coil about a distinct y-axis for irradiating said specimen about said y-axis and said detector is a third coil about a distinct z-axis for receiving said signal about said z-axis.

7. An apparatus as in claim 6, wherein said radio frequency magnetic fields are orthogonal.

8. An apparatus for examining a specimen by nuclear quadrupole resonance, comprising:
(a) a first coil about a first axis;
(b) a second coil about a second axis;
(c) a third coil about a third axis;
(d) a first power source connected to said first coil for generating a first radio frequency pulse having a first predetermined frequency and a first radio frequency magnetic field;
(e) a second power source connected to said second coil for generating a second radio frequency pulse having a second predetermined frequency and a second radio frequency magnetic field; and
(f) a first detector connected to said third coil;
wherein said first and second predetermined frequencies are defined by the nuclear quadrupole resonance frequencies of the nucleus to be examined and wherein said first and second predetermined frequencies are different frequencies, and wherein said detector detects a signal from said specimen at a third frequency.

9. An apparatus as in claim 8, wherein said coils are orthogonal.

10. An apparatus as in claim 8, further comprising:
(a) a fourth coil about same axis as said first coil;
(b) a fifth coil about same axis as said second coil;
(c) a sixth coil about same axis as said third coil;
(d) a second detector connected to said fourth coil; and
(e) a third detector connected to said fifth coil.

11. An apparatus as in claim 10, wherein said axes are orthogonal.

12. A method for detecting a class of target species containing quadrupolar nuclei in a specimen by nuclear quadrupole resonance, comprising:
(a) generating a first radio frequency pulse having a first predetermined frequency;
(b) irradiating said specimen with said first radio frequency pulse;
(c) generating a second radio frequency pulse having a second predetermined frequency;
(d) irradiating said specimen with said second radio frequency pulse; and
(e) detecting a nuclear quadrupole resonance signal at a third frequency in response to irradiating said specimen;
wherein said pulses and nuclear quadrupole resonance signal are defined by the nuclear quadrupole resonance frequencies of the nucleus being examined and wherein said first and second pulses have different frequencies.

13. A method as in claim 12, wherein said first and second radio frequency pulses are irradiated simultaneously.

14. A method as in claim 12, wherein said first and second radio frequency pulses are irradiated sequentially.

15. A method as in claim 12, wherein said first predetermined frequency is set to equal said third frequency and as a result said third frequency now equals what was the value of said first predetermined frequency.

16. A method as in claim 15, wherein said first predetermined frequency is irradiated simultaneously as said second predetermined frequency.

17. A method as in claim 15, wherein said first predetermined frequency is irradiated sequentially with said second predetermined frequency.

18. A method as in claim 12, wherein said first and second radio frequency pulses are near to $^{14}$N nuclear quadrupole resonance frequency of a predetermined type of explosive or narcotic to be detected.

19. A method as in claim 18, wherein said predetermined type of explosive or narcotic to be detected comprises RDX-based explosives.

20. A method as in claim 12, wherein said first predetermined frequency is irradiated both sequentially and simultaneously with said second predetermined frequency.

21. An apparatus, comprising:
a device for irradiating a specimen with a first radio frequency pulse along an x-axis and a second radio frequency pulse along a distinct y-axis and receiving along a distinct z-axis a signal from said specimen in response to said irradiation, wherein said radio frequency pulses and said signal are defined by the nuclear quadrupole resonance frequencies of thy nucleus being examined, and wherein said radio frequency pulses have different frequencies, said first pulse having a frequency at a first transition, said second pulse having a frequency at a second transition, and wherein said signal is received at a third transition frequency.

22. An apparatus as in claim 21, further comprising:
(a) a unit for comparing said signal to a predetermined threshold value; and (b) an alarm for signaling when said signal exceeds said predetermined value.

23. An apparatus as in claim 21, wherein said x-axis, y-axis, and z-axis are orthogonal.

24. An apparatus as in claim 21, wherein said first and second radio frequency pulses are near to $^{14}$N nuclear quadrupole resonance frequencies of a predetermined type of explosive or narcotic to be detected.

25. An apparatus as in claim 24, wherein said predetermined type of explosive or narcotic to be detected comprises RDX-based explosives, HMX, PETN, TNT, ammonium nitrate, potassium nitrate, cocaine, and heroin.

26. An apparatus for examining a specimen by nuclear quadrupole resonance, comprising:
   (a) a first generator for generating a first radio frequency pulse having a first predetermined frequency and a first radio frequency magnetic field;
   (b) a first device for irradiating a specimen with said first radio frequency pulse and said first radio frequency magnetic field;
   (c) a second generator for generating a second radio frequency pulse having a second predetermined frequency and a second radio frequency magnetic field;
   (d) a second device for irradiating said specimen with said second radio frequency pulse and said second radio frequency magnetic field; and
   (e) a detector for detecting a signal from said specimen in response to irradiating said specimen, wherein said radio frequency pulses are determined by the nuclear quadrupole resonance frequencies of the nucleus being examined, wherein said first pulse has a frequency at a first transition, said second pulse has a frequency at a second transition, and wherein said signal is received at a third transition frequency, and said first device is a first coil about an x-axis for irradiating said specimen about said x-axis and said second device is a second coil about a distinct y-axis for irradiating said specimen about said y-axis and said detector is a third coil about a distinct z-axis for receiving said signal about said z-axis.

27. An apparatus as in claim 26, wherein said radio frequency magnetic fields are orthogonal.

28. An apparatus for examining a specimen by nuclear quadrupole resonance, comprising:
   (a) a first coil about a first axis;
   (b) a second coil about a second axis;
   (c) a third coil about a third axis;
   (d) a first power source connected to said first coil for generating a first radio frequency pulse having a first predetermined frequency and a first radio frequency magnetic field;
   (e) a second power source connected to said second coil for generating a second radio frequency pulse having a second predetermined frequency and a second radio frequency magnetic field; and
   (f) a first detector connected to said third coil;
   wherein said first and second predetermined frequencies are defined by the nuclear quadrupole resonance frequencies of the nucleus to be examined and wherein said first pulse has a frequency at a first transition, said second pulse has a frequency at a second transition, and wherein said detector detects a signal at a third transition frequency.

29. An apparatus as in claim 28, wherein said coils are orthogonal.

30. An apparatus as in claim 28, further comprising:
   (a) a fourth coil about same axis as said first coil;
   (b) a fifth coil about same axis as said second coil;
   (c) a sixth coil about same axis as said third coil;
   (d) a second detector connected to said fourth coil; and
   (e) a third detector connected to said fifth coil.

31. An apparatus as in claim 30, wherein said axes are orthogonal.

32. A method for detecting a class of target species containing quadrupolar nuclei in a specimen by nuclear quadrupole resonance, comprising:
   (a) generating a first radio frequency pulse having a first predetermined frequency;
   (b) irradiating said specimen with said first radio frequency pulse;
   (c) generating a second radio frequency pulse having a second predetermined frequency;
   (d) irradiating said specimen with said second radio frequency pulse; and
   (e) detecting a nuclear quadrupole resonance signal at a third frequency in response to irradiating said specimen;
   wherein said pulses and nuclear quadrupole resonance signal are defined by the nuclear quadrupole resonance frequencies of the nucleus being examined and wherein said first and second pulses have different frequencies, wherein said first pulse has a frequency at a first transition, said second pulse has a frequency at a second transition, and wherein said signal is received at a third transition frequency.

33. A method as in claim 32, wherein said first and second radio frequency pulses are irradiated simultaneously.

34. A method as in claim 32, wherein said first and second radio frequency pulses are irradiated sequentially.

35. A method as in claim 32, wherein said first predetermined frequency is set to equal said third frequency and as a result said third frequency now equals what was the value of said first predetermined frequency.

36. A method as in claim 35, wherein said first predetermined frequency is irradiated simultaneously as said second predetermined frequency.

37. A method as in claim 35, wherein said first predetermined frequency is irradiated sequentially with said second predetermined frequency.

38. A method as in claim 32, wherein said first and second radio frequency pulses are near to $^{14}$N nuclear quadrupole resonance frequencies of a predetermined type of explosive or narcotic to be detected.

39. A method as in claim 38, wherein said predetermined type of explosive or narcotic to be detected comprises RDX-based explosives.

40. A method as in claim 32, wherein said first predetermined frequency is irradiated both sequentially and simultaneously with said second predetermined frequency.

* * * * *